United States Patent
Schmidt et al.

(10) Patent No.: US 10,655,965 B2
(45) Date of Patent: May 19, 2020

(54) ROTATIONAL SPEED SENSOR WITH MINIMIZED INTERFERENCE MOVEMENTS IN THE DRIVING MODE

(71) Applicant: Robert Bosch GmbH, Stuttgart (DE)

(72) Inventors: Benjamin Schmidt, Stuttgart (DE); Andreas Lassl, Ditzingen (DE); Burkhard Kuhlmann, Reutlingen (DE); Christian Hoeppner, Stuttgart (DE); Mirko Hattass, Stuttgart (DE); Thorsten Balslink, Kirchentellinsfurt (DE)

(73) Assignee: Robert Bosch GmbH, Stuttgart (DE)

( * ) Notice: Subject to any disclaimer, the term of this patent is extended or adjusted under 35 U.S.C. 154(b) by 327 days.

(21) Appl. No.: 15/742,810

(22) PCT Filed: May 24, 2016

(86) PCT No.: PCT/EP2016/061717
§ 371 (c)(1),
(2) Date: Jan. 8, 2018

(87) PCT Pub. No.: WO2017/012748
PCT Pub. Date: Jan. 26, 2017

(65) Prior Publication Data
US 2018/0202808 A1    Jul. 19, 2018

(30) Foreign Application Priority Data

Jul. 17, 2015    (DE) .................... 10 2015 213 447

(51) Int. Cl.
*G01C 19/5747*    (2012.01)
*B81B 3/00*    (2006.01)
(Continued)

(52) U.S. Cl.
CPC ........ *G01C 19/5747* (2013.01); *B81B 3/0054* (2013.01); *G01C 19/5712* (2013.01);
(Continued)

(58) Field of Classification Search
CPC ............ G01C 19/5747; G01C 19/5712; G01C 19/5726; G01C 19/5762; G01C 19/5705; B81B 3/0054; B81B 2201/0228
(Continued)

(56) References Cited

U.S. PATENT DOCUMENTS

2012/0247206 A1    10/2012    Ohms et al.
2013/0104651 A1    5/2013    Li et al.

FOREIGN PATENT DOCUMENTS

DE    102011006394 A1    10/2012
DE    102011006453 A1    10/2012
(Continued)

OTHER PUBLICATIONS

International Search Report dated Aug. 22, 2016, of the corresponding International Application PCT/EP2016/061717 filed May 24, 2016.

*Primary Examiner* — Robert R Raevis
(74) *Attorney, Agent, or Firm* — Norton Rose Fulbright US LLP; Gerard Messina

(57) ABSTRACT

A rotation rate sensor having a first structure movable with respect to the substrate, a second structure movable with respect to the substrate and with respect to the first structure, a first drive structure for deflecting the first structure with a motion component parallel to a first axis, and a second drive structure for deflecting the second structure with a motion component parallel to the first axis. The first and second structures are excitable to oscillate in counter-phase, with motion components parallel to the first axis, the first drive structure having a first spring mounted on the substrate to
(Continued)

counteract a pivoting of the first structure around an axis parallel to a second axis extending perpendicularly to a principal extension plane, the second drive structure having a second spring mounted on the substrate to counteracts a pivoting of the second structure around a further axis parallel to the second axis.

8 Claims, 3 Drawing Sheets

(51) Int. Cl.
- *G01C 19/5712* (2012.01)
- *G01C 19/5726* (2012.01)
- *G01C 19/5762* (2012.01)

(52) U.S. Cl.
CPC ..... *G01C 19/5726* (2013.01); *G01C 19/5762* (2013.01); *B81B 2201/0228* (2013.01)

(58) Field of Classification Search
USPC .................. 73/488, 504.04, 514.15, 514.29
See application file for complete search history.

(56) References Cited

FOREIGN PATENT DOCUMENTS

| | | |
|---|---|---|
| DE | 102012210374 A1 | 12/2013 |
| JP | 2004518970 A | 6/2004 |
| JP | 2008014727 A | 1/2008 |

ROTATIONAL SPEED SENSOR WITH MINIMIZED INTERFERENCE MOVEMENTS IN THE DRIVING MODE

FIELD

The present invention relates to a rotation rate sensor.

BACKGROUND INFORMATION

A rotation rate sensor is described, for example, in German Patent Application No. DE 10 2011 006 394 A1. In the context of a counter-phase oscillation, the first and the second structure of such a rotation rate sensor each execute a swinging motion, or 2f motion, orthogonally to the drive direction, i.e. orthogonally to the first axis. A detection signal, or 2f signal, at twice the drive frequency is thereby caused.

SUMMARY

An example rotation rate sensor according to the present invention may have the advantage as compared with the existing art that the rotation rate sensor according to the present invention specifically makes possible a reduction in the 2f motion, and thus a reduction in the 2f signal, without negatively influencing the remaining sensor properties. At the same time, the rotation rate sensor according to the present invention has a configuration that is simple, mechanically robust, and inexpensive as compared with existing rotation rate sensors. The example rotation rate sensor in accordance with the present invention is furthermore made possible on a substrate area that is small relative to the existing rotation rate sensors, since only a small substrate area, relative to the existing rotation rate sensors, is needed for the micromechanical structure for the detection of rotation rates. A rotation rate sensor that is robust with respect to external interference influences is furthermore furnished. This is achieved by the fact that unlike prior rotation rate sensors, the first drive structure has at least one first spring mounted on the substrate in such a way that the first spring counteracts a pivoting of the first structure substantially around an axis extending parallel to a second axis extending perpendicularly to the principal extension plane, the second drive structure having at least one second spring mounted on the substrate in such a way that the second spring counteracts a pivoting of the second structure substantially around a further axis extending parallel to the second axis. As a result, the mechanical nonlinearity of the rotation rate sensor can be specifically adjusted, and thus the 2f motion and the 2f signal can be reduced, with the aid of the first spring and/or the second spring.

Advantageous embodiments and refinements of the present invention are described herein and are shown in the figures.

According to a preferred refinement of the present invention, provision is made that the rotation rate sensor encompasses at least one third drive structure for deflecting the first structure out of an idle position of the first structure with a motion component substantially parallel to the first axis, the third drive structure having at least one third spring mounted on the substrate in such a way that the third spring counteracts a pivoting of the first structure substantially around the axis extending parallel to the second axis. What is thereby provided, advantageously, is a rotation rate sensor whose nonlinearity can be specifically adjusted with the aid of the third spring, and whose 2f motion, as well as the 2f signal generated by the 2f motion, can thus be specifically reduced.

According to a preferred refinement of the present invention, provision is made that the rotation rate sensor encompasses at least one fourth drive structure for deflecting the second structure out of an idle position of the second structure with a motion component substantially parallel to the first axis, the fourth drive structure having at least one fourth spring mounted on the substrate in such a way that the fourth spring counteracts a pivoting of the second structure substantially around the further axis extending parallel to the second axis. What is advantageously made possible thereby is that the nonlinearity can be specifically adjusted with the aid of the fourth spring so that the 2f motion, as well as the 2f signal generated by the 2f motion, can be specifically reduced.

According to a preferred refinement of the present invention, provision is made that the rotation rate sensor encompasses a first coupling structure for coupling the first drive structure to the second drive structure in such a way that the first drive structure and the second drive structure are deflectable to oscillate substantially in counter-phase, with motion components substantially parallel to the first axis. This advantageously makes it possible for the first structure and the second structure to be excitable to oscillate substantially in counter-phase, with motion components substantially parallel to the first axis.

According to a preferred refinement of the present invention, provision is made that the rotation rate sensor encompasses a second coupling structure for coupling the third drive structure to the fourth drive structure in such a way that the third drive structure and the fourth drive structure are deflectable to oscillate substantially in counter-phase, with motion components substantially parallel to the first axis. Excitation of the first structure and the second structure to oscillate substantially in counter-phase, with motion components substantially parallel to the first axis, is thereby advantageously enabled.

According to a preferred refinement of the present invention, provision is made that the rotation rate sensor encompasses a third coupling structure, partly surrounded by the first structure and by the second structure, for coupling the first structure to the second structure in such a way that the first structure and the second structure are deflectable to oscillate substantially in counter-phase, with a motion component substantially parallel to the first axis and/or with a motion component substantially parallel to a third axis extending perpendicularly to the first axis and perpendicularly to the second axis. This advantageously makes it possible for a rotation rate acting on the rotation rate sensor around an axis extending parallel to the second axis to be detectable. This furthermore advantageously makes it possible for the rotation rate sensor to be furnished on a substrate area that is small relative to the existing rotation rate sensors, and for the center of gravity of the first structure and the center of gravity of the second structure to be disposed, unlike in the existing rotation rate sensors, closer to the axis of symmetry of the rotation rate sensor. In accordance with the present invention, a rotation rate sensor that is robust in particular with respect to external interference acting, for example, in a drive direction, for example linear accelerations, is thereby furnished. A configuration of this kind is advantageous in terms of robustness with respect to linear accelerations in a drive direction because the lever relationships are more favorable with more-central centers of mass, and as a result the deflection of the sensor in the context of an external linear acceleration in a drive direction is reduced.

According to a preferred refinement of the present invention, provision is made that the first structure encompasses a first Coriolis structure as well as a first detection structure, at least partly surrounded by the first Coriolis structure, for detecting a first force acting on the first structure, and the second structure encompasses a second Coriolis structure as well as a second detection structure, at least partly surrounded by the second Coriolis structure, for detecting a second force acting on the second structure, the first force and the second force each encompassing a force component in a direction substantially parallel to a third axis, extending perpendicularly to the first axis and perpendicularly to the second axis, as a result of a rotation rate of the rotation rate sensor around an axis substantially parallel to the second axis. This advantageously makes it possible for a rotation rate of the rotation rate sensor around the axis substantially parallel to the second axis to be detectable by the rotation rate sensor. According to a preferred refinement, provision is made that the first spring and/or the second spring and/or the third spring and/or the fourth spring encompasses at least one substrate-mounted first spring beam, at least one substrate-mounted second spring beam, at least one flexurally rigid beam connecting the first spring beam and the second spring beam, at least one third spring beam connecting the flexurally rigid beam and the respective drive structure, and at least one fourth spring beam connecting the flexurally rigid beam and the respective drive structure. Advantageously, specific adjustment of the mechanical nonlinearity of the rotation rate sensor, and thus a reduction in the 2f motion and in the 2f signal, is thus made possible with the aid of the first spring beam and/or the second spring beam and/or the third spring beam and/or the fourth spring beam and/or the beam. In particular, the 2f motion can advantageously be counteracted by specific adjustment of the geometric parameters, in particular the width and length ratios, of the first spring beam and/or of the second beam and/or of the third spring beam and/or of the fourth spring beam by way of a compensating 2f force of the first spring and/or of the second spring and/or of the third spring and/or of the fourth spring. The 2f motion is thereby advantageously minimized. The spring stiffness of the first spring and/or of the second spring and/or of the third spring and/or of the fourth spring and/or of the beam can furthermore advantageously be adjusted with the aid of the lengths and widths of the first spring beam and/or of the second spring beam and/or of the third spring beam and/or of the fourth spring beam and/or of the beam. It is thereby advantageously possible to adjust the compensating 2f force independently of the adjustment of the spring stiffness.

DETAILED DESCRIPTION OF EXAMPLE EMBODIMENTS

Figure 1:
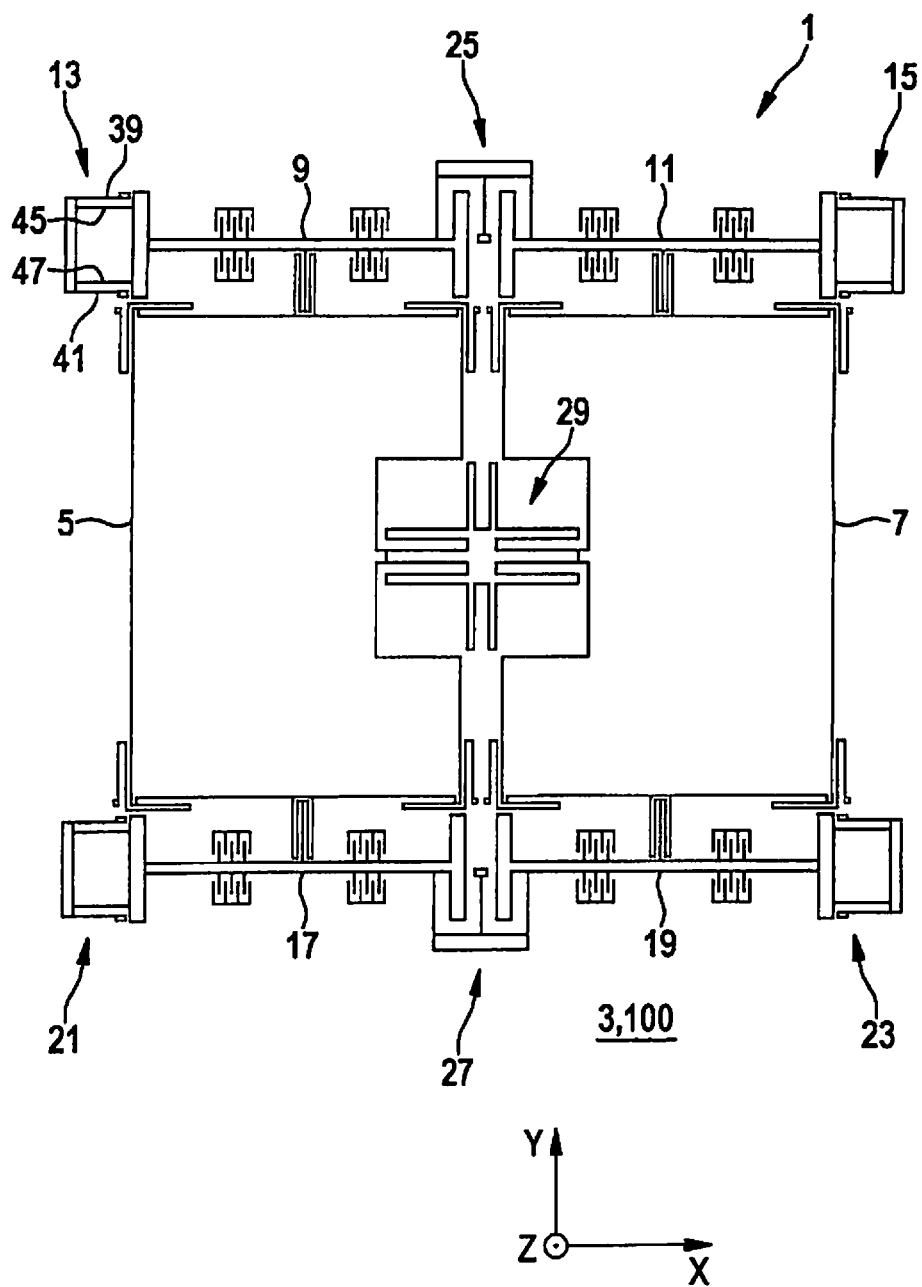
FIG. 1 schematically depicts a rotation rate sensor according to a first exemplifying embodiment of the present invention.

Identical parts in the various Figures are labeled with the same reference characters and are each therefore, generally, also recited or mentioned only once.

FIG. 1 schematically depicts a rotation rate sensor 1 according to a first exemplifying embodiment of the present invention, rotation rate sensor 1 encompassing a substrate 3 having a principal extension plane 100 and a first structure 5 movable with respect to substrate 3, and a second structure 7 movable with respect to substrate 3 and with respect to first structure 5. Rotation rate sensor 1 in FIG. 1 furthermore encompasses, by way of example, a first drive structure 9 and a third drive structure 17 for deflecting first structure 5 out of an idle position, depicted in FIG. 1, of first structure 5 with a motion component substantially parallel to a first axis Y. Rotation rate sensor 1 in FIG. 1 furthermore encompasses, by way of example, a second drive structure 11 and a fourth drive structure 19 for deflecting second structure 7 out of an idle position, depicted in FIG. 1, of second structure 7 with a motion component substantially parallel to first axis Y. First structure 5 and second structure 7 are thereby excitable to oscillate substantially in counter-phase, with motion components substantially parallel to first axis Y.

Also depicted by way of example in FIG. 1 is the fact that first drive structure 9 and third drive structure 17 respectively have a first spring 13 and third spring 21 mounted on substrate 3 in such a way that first spring 13 and third spring 21 counteract a pivoting of first structure 5 substantially around an axis extending parallel to a second axis Z. FIG. 1 comparably depicts the fact that second drive structure 11 and fourth drive structure 19 respectively have a second spring 15 and fourth spring 23 mounted on substrate 3 in such a way that second spring 15 and fourth spring 23 counteract a pivoting of second structure 7 substantially around a further axis extending parallel to second axis Z.

The rotation rate sensor depicted by way of example in FIG. 1 furthermore encompasses a first coupling structure 25 for coupling first drive structure 9 to second drive structure 11 and a second coupling structure 27 for coupling third drive structure 17 to fourth drive structure 19, in such a way that first drive structure 9 and second drive structure 11, and third drive structure 17 and fourth drive structure 19, are each deflectable to oscillate substantially in counter-phase, with motion components substantially parallel to first axis Y. FIG. 1 additionally shows a third coupling structure 29, at least partly surrounded by first structure 5 and by second structure 7, for coupling first structure 5 to second structure 7. Third coupling structure 29 makes it possible for first structure 5 and second structure 7 to be deflectable to oscillate substantially in counter-phase, with motion components substantially parallel to first axis Y and/or with a motion component substantially parallel to a third axis X.

Figure 2:
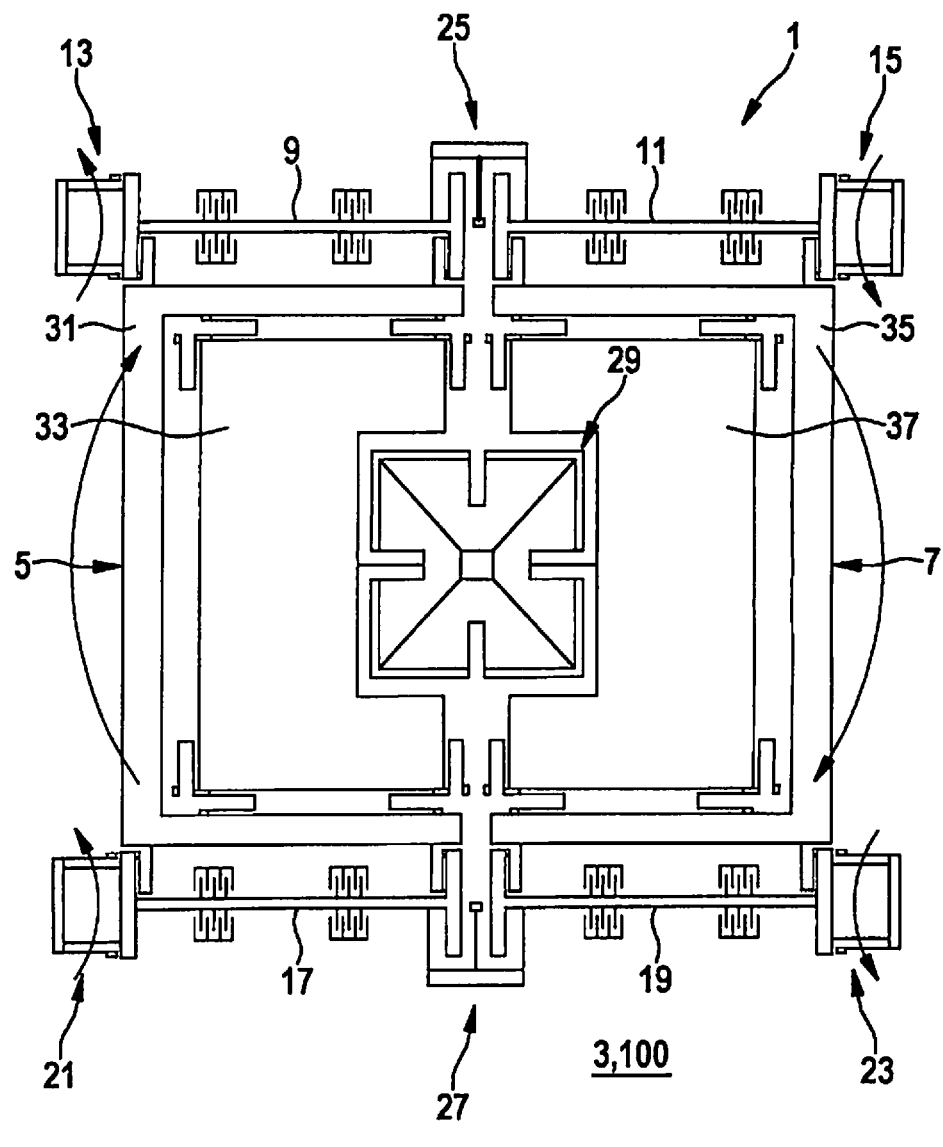
FIG. 2 schematically depicts a rotation rate sensor according to a second exemplifying embodiment of the present invention.

FIG. 2 schematically depicts a rotation rate sensor 1 according to a second exemplifying embodiment of the present invention, first structure 5 encompassing a first Coriolis structure 31 and a first detection structure 33, at least partly surrounded by first Coriolis structure 31, for detecting a first force acting on first structure 5. Second structure 7 furthermore encompasses a second Coriolis structure 35 and a second detection structure 37, at least partly surrounded by second Coriolis structure 35, for detecting a second force acting on second structure 7. The first force and the second force each encompass a force component, in a direction substantially parallel to a third axis X, as a result of a rotation rate of rotation rate sensor 1 around an axis substantially parallel to second axis Z. Third coupling structure 29 depicted in FIG. 2 makes it possible, for example, for first detection structure 33 and second detection structure 37 to be deflectable to oscillate substantially in counter-phase, with motion components substantially parallel to third axis X.

A possible 2f motion of first structure 5 and of second structure 7 is also depicted in FIG. 2 with the aid of arrows in the region of first Coriolis structure 31 and in the region of second Coriolis structure 35. The 2f motion proceeds in the same direction upon both an upward and a downward motion, i.e. upon a pivoting motion both back and forth. Coriolis structures 31, 35 thus execute a slight swinging motion (2f motion). This motion, laterally to the drive direction, is transferred to detection structures 33, 37 and results in a detection signal at twice the drive frequency. A compensating 2f force that counteracts the possible 2f motion is also shown in FIG. 2 with the aid of further arrows in the region of first spring 13, second spring 15, third spring 21, and fourth spring 23.

The exemplifying embodiments depicted in FIG. 1 and FIG. 2 respectively encompass drive structures 9, 11, 17, 19 and springs 13, 15, 21, 23. Also preferably provided, however, is a rotation rate sensor having, for example, only first drive structure 9 and first spring 13, or having any desired number of drive structures 9, 11, 17, 19 and springs 13, 15, 21, 23, in particular a number of drive structures and/or springs equal to 3, 5, 6, 7, 8, 9, 10, 11, 12, 13, 14, 15, 16.

Figure 3A:
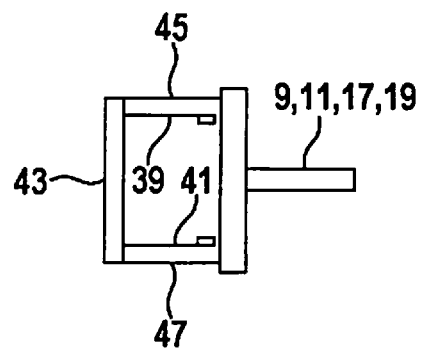
FIGS. 3a-3c schematically depict exemplifying portions of a rotation rate sensor according to further exemplifying embodiments of the present invention.
Figure 3B:
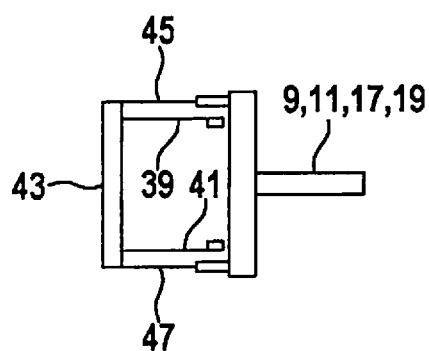
Figure 3C:
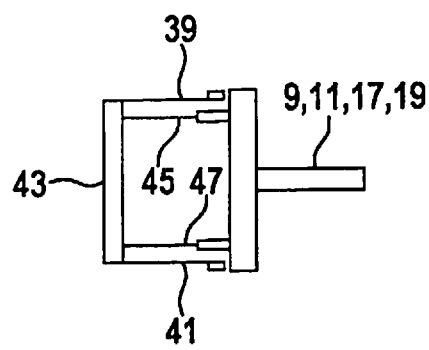

FIGS. 3a, 3b, 3c schematically depict an exemplifying portion of a rotation rate sensor 1 according to further exemplifying embodiments of the present invention, first spring 13 and/or second spring 15 and/or third spring 21 and/or fourth spring 23 encompassing a substrate-mounted first spring beam 39, a substrate-mounted second spring beam 41, a flexurally rigid beam 43 connecting first spring beam 39 and second spring beam 41, a third spring beam 45 connecting flexurally rigid beam 43 and the respective drive structure 9, 11, 17, 19, and a fourth spring beam 47 connecting flexurally rigid beam 43 and the respective drive structure 9, 11, 17, 19.

FIG. 3a schematically shows a first embodiment of springs 13, 15, 21, 23, springs 13, 15, 21, 23 encompassing short internal spring beams 39, 41. FIG. 3b schematically shows a second embodiment of springs 13, 15, 21, 23, springs 13, 15, 21, 23 encompassing effectively shortened external spring beams 45, 47, thus resulting in an inverted nonlinearity. FIG. 3c schematically shows a third embodiment of springs 13, 15, 21, 23, springs 13, 15, 21, 23 encompassing substrate-mounted external spring beams 39, 41 and internal spring beams 45, 47.

The 2f forces of springs 13, 15, 21, 23 can thereby be adjusted, for example, by way of the width and length ratios of the spring beams. Springs 13, 15, 21, 23 can thereby be adapted in such a way that the springs counteract the 2f forces of the remainder of the sensor, and minimize the resulting 2f motion. The advantage offered by suspension of drive structures 9, 11, 17, 19 on springs 13, 15, 21, 23 is that the mechanical nonlinearities of springs 13, 15, 21, 23 can be adjusted by way of their geometric parameters so that the 2f forces of the sensor element are compensated for by the nonlinearities of springs 13, 15, 21, 23. Both the magnitude and the direction of the 2f forces of springs 13, 15, 21, 23 can be varied by way of the width and length ratios of external and internal spring beams 39, 41, 45, 47. Inverting the length ratios of spring beams 39, 41, 45, 47, for example (FIG. 3a and FIG. 3b), allows the direction of the resulting 2f force of springs 13, 15, 21, 23 to be inverted. The spring stiffness can be controlled by way of the absolute lengths and widths of the individual spring beams 39, 41, 45, 47, so that the spring stiffness and the 2f force can be adjusted mutually independently.

Springs 13, 15, 21, 23 furthermore offer the advantage that they are very stiff with respect to tilting motions. In other words, the beam that belongs to the respective drive structure 9, 11, 17, 19, and is suspended on one of springs 13, 15, 21, 23, oscillates in the fundamental mode parallel to the beam connection of the spring heads, and possible rotational motions are shifted to very high frequencies.

What is claimed is:

1. A rotation rate sensor, comprising:
    a substrate having a principal extension plane;
    at least one first structure movable with respect to the substrate;
    at least one second structure movable with respect to the substrate and with respect to the first structure;
    at least one first drive structure for deflecting the first structure out of an idle position of the first structure with a motion component parallel to a first axis; and
    at least one second drive structure for deflecting the second structure out of an idle position of the second structure with a motion component parallel to the first axis, the first structure and second structure being excitable to oscillate in counter-phase, with motion components parallel to the first axis;
    wherein the first drive structure has at least one first spring mounted on the substrate in such a way that the first spring counteracts a pivoting of the first structure around an axis extending parallel to a second axis extending perpendicularly to the principal extension plane, and the second drive structure has at least one second spring mounted on the substrate in such a way that the second spring counteracts a pivoting of the second structure around a further axis extending parallel to the second axis.

2. The rotation rate sensor as recited in claim 1, further comprising:
    at least one third drive structure for deflecting the first structure out of an idle position of the first structure with a motion component parallel to the first axis, the third drive structure having at least one third spring mounted on the substrate in such a way that the third spring counteracts a pivoting of the first structure around the axis extending parallel to the second axis.

3. The rotation rate sensor as recited in claim 2, further comprising:
    at least one fourth drive structure for deflecting the second structure out of an idle position of the second structure with a motion component parallel to the first axis, the fourth drive structure having at least one fourth spring mounted on the substrate in such a way that the fourth spring counteracts a pivoting of the second structure around the further axis extending parallel to the second axis.

4. The rotation rate sensor as recited in claim 3, wherein at least one of the first spring, the second spring, the third spring, and the fourth spring encompasses at least one substrate-mounted first spring beam, at least one substrate-mounted second spring beam, at least one flexurally rigid beam connecting the first spring beam and the second spring beam, at least one third spring beam connecting the flexurally rigid beam and the respective drive structure, and at least one fourth spring beam connecting the flexurally rigid beam and the respective drive structure.

5. The rotation rate sensor as recited in claim 1, further comprising:
a first coupling structure for coupling the first drive structure to the second drive structure in such a way that the first drive structure and the second drive structure are deflectable to oscillate in counter-phase, with motion components parallel to the first axis.

6. The rotation rate sensor as recited in claim 1, further comprising:
a second coupling structure for coupling the third drive structure to the fourth drive structure in such a way that the third drive structure and the fourth drive structure are deflectable to oscillate in counter-phase, with motion components parallel to the first axis.

7. The rotation rate sensor as recited in claim 1, further comprising:
a third coupling structure, partly surrounded by the first structure and by the second structure, for coupling the first structure to the second structure in such a way that the first structure and the second structure are deflectable to oscillate in counter-phase, with a motion component at least one of: (i) parallel to the first axis, and (ii) parallel to a third axis extending perpendicularly to the first axis and perpendicular to the second axis.

8. The rotation rate sensor as recited in claim 1, wherein the first structure encompasses a first Coriolis structure and a first detection structure, at least partly surrounded by the first Coriolis structure, for detecting a first force acting on the first structure, and wherein the second structure encompasses a second Coriolis structure and a second detection structure, at least partly surrounded by the second Coriolis structure, for detecting a second force acting on the second structure, the first force and the second force each encompassing a force component in a direction parallel to a third axis, extending perpendicularly to the first axis and perpendicularly to the second axis, as a result of a rotation rate of the rotation rate sensor around an axis substantially parallel to the second axis.

* * * * *